United States Patent
Classen

(10) Patent No.: US 11,014,807 B2
(45) Date of Patent: May 25, 2021

(54) METHOD FOR PRODUCING A SYSTEM INCLUDING A FIRST MICROELECTROMECHANICAL ELEMENT AND A SECOND MICROELECTROMECHANICAL ELEMENT, AND A SYSTEM

(71) Applicant: Robert Bosch GmbH, Stuttgart (DE)

(72) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/433,108

(22) Filed: Jun. 6, 2019

(65) Prior Publication Data

US 2019/0382263 A1 Dec. 19, 2019

(30) Foreign Application Priority Data

Jun. 14, 2018 (DE) ...................... 10 2018 209 483.7

(51) Int. Cl.
  *B81C 3/00* (2006.01)
  *B81B 7/00* (2006.01)

(52) U.S. Cl.
  CPC ............ *B81C 3/001* (2013.01); *B81B 7/0038* (2013.01); *B81B 2201/025* (2013.01); *B81B 2201/0235* (2013.01); *B81C 2203/031* (2013.01); *B81C 2203/0785* (2013.01)

(58) Field of Classification Search
  CPC ............ B81C 3/001; B81C 2203/0118; B81C 2201/0242; B81C 1/00293; B81C 1/00134; B81C 1/00952; B81C 1/00269; B81C 1/00984; B81B 7/0038; B81B 7/02; H01L 2924/1461; H01L 2924/12042
  See application file for complete search history.

(56) References Cited

U.S. PATENT DOCUMENTS 8,129,838 B2 * 3/2012 Reinert ................... B81B 7/007
  257/685
9,570,321 B1 * 2/2017 Black .................. H01L 21/3221
(Continued)

FOREIGN PATENT DOCUMENTS

DE 102015224523 A1 6/2017
EP 2004542 12/2008

*Primary Examiner* — Khiem D Nguyen
(74) *Attorney, Agent, or Firm* — Norton Rose Fulbright US LLP; Gerard Messina

(57) ABSTRACT

A method for producing a system, including a first microelectromechanical element and a second microelectromechanical element, including the following: providing, a substrate, having the first microelectromechanical element and the second microelectromechanical element, and a cap element, a getter material being situated on the substrate in a first region in a surrounding environment of the first microelectromechanical element and/or on the cap element in a first corresponding region; situating the cap element on the substrate using a wafer bonding technique so that a sealed first chamber is formed that contains the first microelectromechanical element and the first region and/or the first corresponding region, a sealed second chamber being formed that contains the second microelectromechanical element; producing an opening in the second chamber; and sealing the opening at a first ambient pressure, in particular a first gas pressure.

12 Claims, 8 Drawing Sheets

(56) References Cited

U.S. PATENT DOCUMENTS

| | | | |
|---|---|---|---|
| 2011/0048129 A1* | 3/2011 | Yamanaka | G01C 19/5769 73/504.12 |
| 2012/0326248 A1* | 12/2012 | Daneman | B81B 7/02 257/415 |
| 2013/0285162 A1* | 10/2013 | Lutz | B81C 1/00269 257/415 |
| 2014/0015069 A1* | 1/2014 | Liang | B81C 1/00285 257/415 |
| 2014/0225206 A1* | 8/2014 | Lin | B81B 7/02 257/417 |
| 2014/0227816 A1* | 8/2014 | Zhang | B81B 7/0041 438/48 |
| 2014/0374851 A1* | 12/2014 | Liu | B81C 1/00611 257/415 |
| 2015/0137280 A1* | 5/2015 | Chu | B81B 7/02 257/415 |
| 2015/0351246 A1 | 12/2015 | Baillin | |
| 2015/0360937 A1* | 12/2015 | Reinmuth | B81B 7/0038 257/417 |
| 2016/0137487 A1 | 5/2016 | Nicolas | |
| 2016/0355394 A1* | 12/2016 | Tseng | B81C 1/00293 |
| 2016/0368763 A1* | 12/2016 | Gonska | B81C 1/00293 |
| 2017/0096330 A1* | 4/2017 | Dueweke | B81B 7/0038 |
| 2018/0339900 A1* | 11/2018 | Breitling | B81B 7/02 |

* cited by examiner

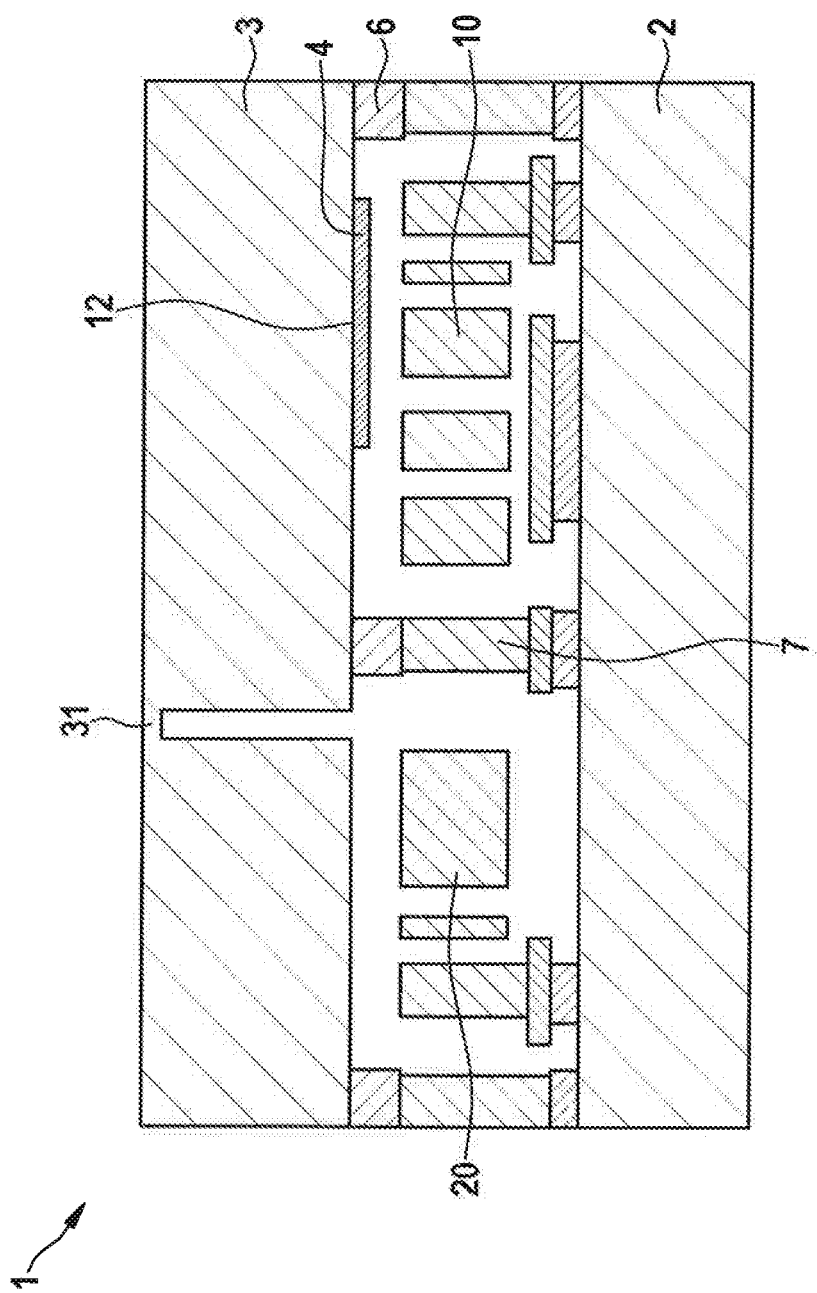

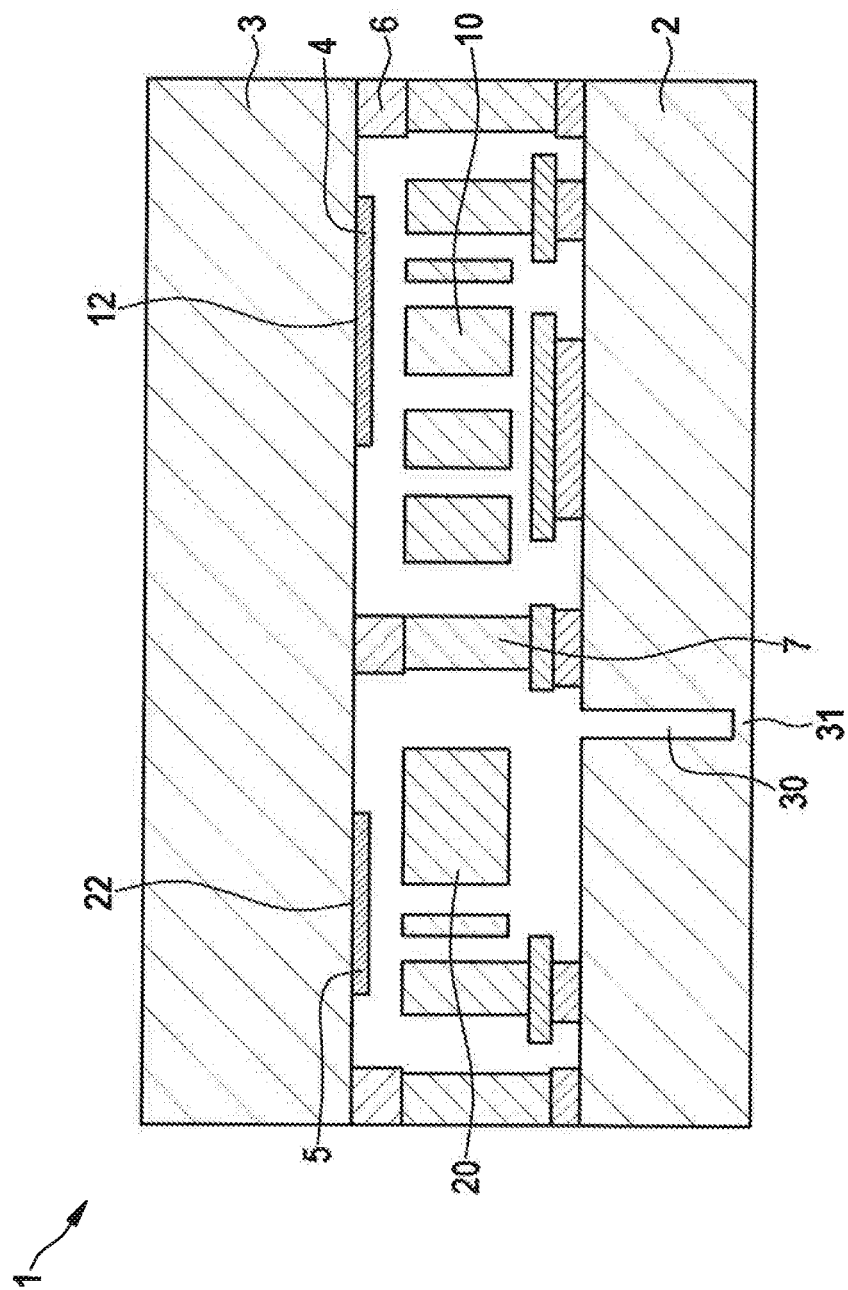

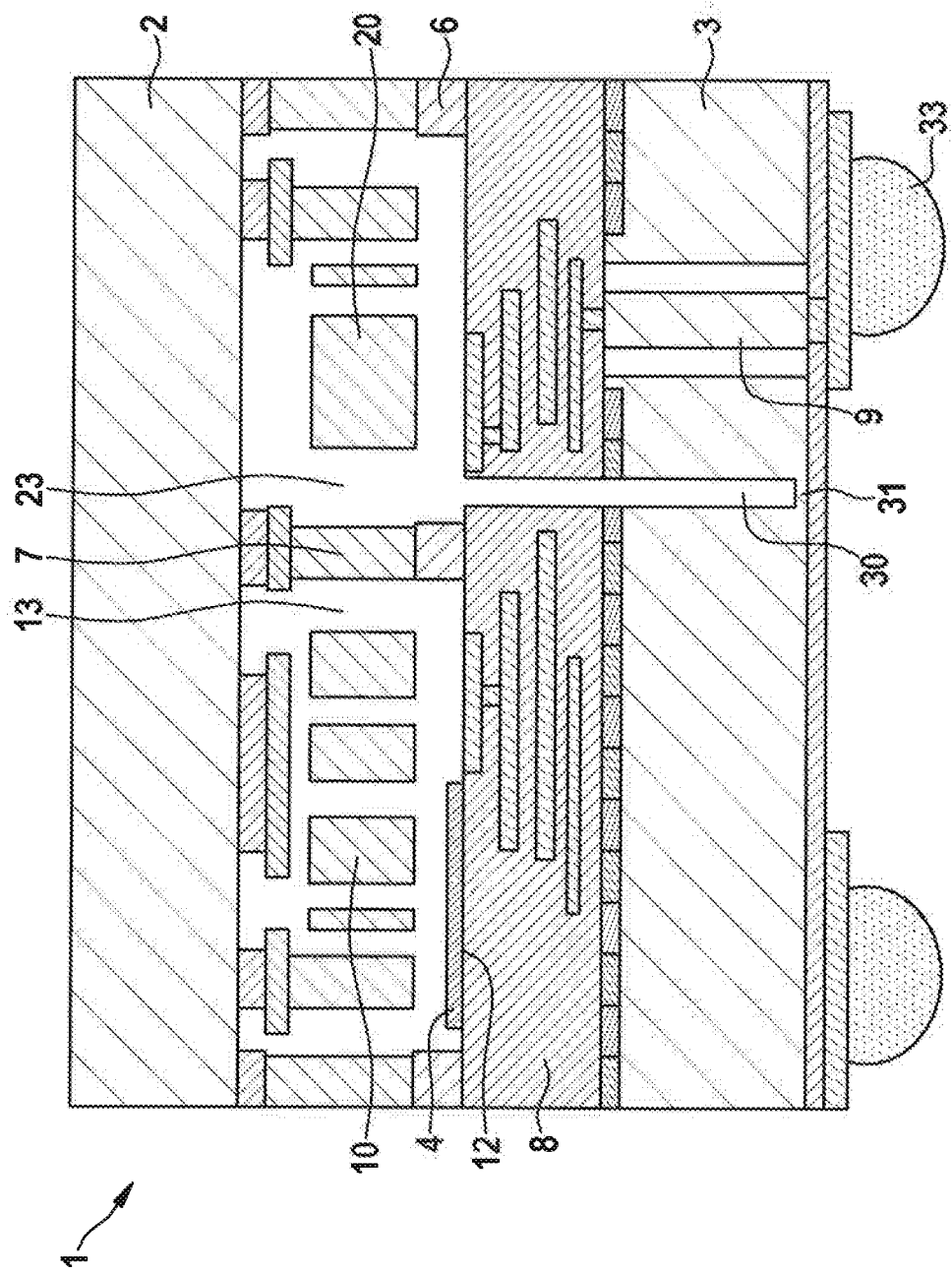

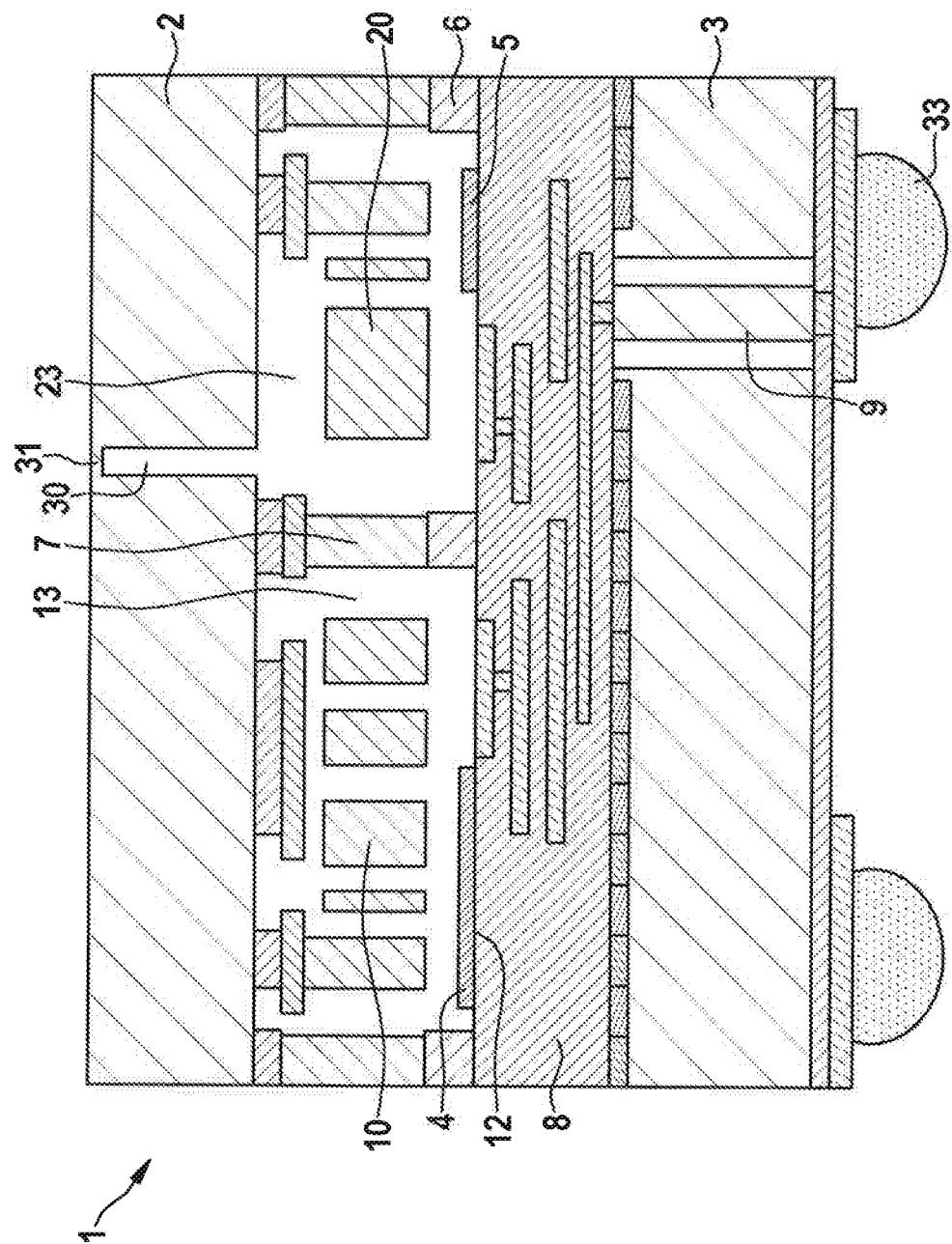

METHOD FOR PRODUCING A SYSTEM INCLUDING A FIRST MICROELECTROMECHANICAL ELEMENT AND A SECOND MICROELECTROMECHANICAL ELEMENT, AND A SYSTEM

FIELD OF THE INVENTION

The present invention relates to a method for producing a system including a first microelectromechanical element and a second microelectromechanical element.

BACKGROUND INFORMATION

Microelectromechanical sensors for measuring, for example, accelerations, rates of rotation, magnetic fields, or pressures, are known and are produced in mass production at the wafer scale for various automotive and consumer applications. Developments in this area are significantly driven by the continuing miniaturization of the components, saving both space and costs. Correspondingly, systems are becoming more important in which at least two different microelectromechanical systems are situated on one chip, whereby more functionality can be achieved in the same constructive space and the integration density (i.e. the realization of more functionality in the same constructive space) is increased. Such configurations require special production methods with which different sensor types, for example a rotational rate sensor and an acceleration sensor, can be situated in a small constructive space. However, in such systems it is a problem that the different sensor types require different ambient pressures for their respectively optimal functionality. Correspondingly, there is a need for production methods that make it possible to provide different sensors on one chip with different chamber pressures.

Various methods for setting up two caverns having different internal pressures are known from the existing art. For example, from EP 2004542 B1 it is known for a first of two cavities, having a microelectromechanical (MEMS) component, to be provided with a getter material, and for the bonding of the substrate and the cap to take place in a gas atmosphere that has at least one type of gas that can be absorbed by the first getter material. In this way, due to the absorption properties of the getter material, after the activation of the getter material a lower internal pressure is achieved in the first cavity than in the second cavity.

However, in such methods it is a problem that high temperatures are frequently required in wafer bonding processes. For example, in the most commonly used metallic bonding processes, wafer bonding with a eutectic alloy of aluminum and germanium, a temperature above 430° C. is required for the formation of the eutectic phase. However, in most standardly used getter materials, activation already begins significantly below this temperature (in the range above 300° C.). Correspondingly, at the time of the getter activation the bonding frame of the formed chambers/caverns is not yet completely hermetically sealed despite high pressure onto the wafers. On the one hand, in this way a gas exchange may still take place between the cavern, containing the getter material, of the one sensor (for example a rotational rate sensor) and the cavern, free of getter material, of the other sensor (for example an acceleration sensor). On the other hand, a gas diffusion of chips among one another and between chips at the outer wafer edge and the bonding chamber is possible. In the first case, the cavern of the acceleration sensor may be partly evacuated, indirectly and undesirably, via the getter in the rotational rate sensor cavern. In the other case, fresh gas can continuously undergo residual diffusion in chips at the wafer edge until the sorption capacity of the getter in the rotational rate sensor cavern is exhausted. In sum, therefore, it can happen both that the internal pressure in the chamber of the acceleration sensor is too low and that the internal pressure in the chamber of the rotational rate sensor is too high.

An alternative method is known from US 2012 0326248 A1. Here, after the sealing of the caverns, one of the caverns is opened, a suitable pressure is set, and the cavern is then sealed again. Here it is disadvantageous that when the components are exposed to higher temperatures (for example during later process steps such as tempering steps during the further processing of the wafer, or during soldering of the individual components onto the application circuit board) bound process gases such as $H_2$ or possibly argon may be subsequently released from the various parts of the wafer (for example from the oxide layers of a CMOS backend (metal-oxide stack)), which in some circumstances can cause a massive undesirable increase in the cavern internal pressure. Even the application of additional outgassing barriers (for example layers of metal or dielectric), which additionally complicates the production process, cannot reliably prevent such problems in all cases.

SUMMARY OF THE INVENTION

An object of the present invention is to propose a method for producing a system including a first microelectromechanical element and a second microelectromechanical element with which the desired internal pressures/operating pressures for the microelectromechanical elements can be provided in a particularly robust fashion.

The method according to the present invention for producing a system including a first microelectromechanical element and a second microelectromechanical element according to the main claim has the advantage, compared to the existing art, that problems that may arise due to a not-yet-imposed hermetic seal between the first and second chamber during the wafer bonding, or due to later outgassing of bound gases, can be eliminated. The wafer bonding in the second step can be carried out at a pressure that can be set arbitrarily, for example even at a very low pressure that, if warranted, is below the ideal pressure for the operation of the second microelectromechanical element. In contrast, the internal pressure of the second microelectromechanical element can advantageously not be set until later, in the fourth step, through the selection of the first ambient pressure when the opening is sealed. Thus, according to the present invention, through the situation of a getter material in the first chamber in combination with the third and fourth step according to claim 1, it is possible that even in cases in which a (partial) activation of the getter material takes place already during the wafer bonding, an advantageously reliable setting of the chamber pressures can take place, in particular because the pressure in the chambers and in the bonding area does not have to be high during the wafer bonding. A saturation of the getter material can thus advantageously be avoided even in such cases. It is also possible according to the present invention that a later outgassing of bound process gases (for example $H_2$) does not increase the pressure in the first chamber in an undesired manner, because the non-saturated getter material situated there can bind such gases. Correspondingly, according to the present invention it is possible to ensure a particularly robust method with which different internal pressures can be set in the chambers. A further advantage is that during the sealing of the opening in the fourth step the gas type (or gas types) and the first ambient pressure can be flexibly selected. Thus, the internal pressure in the second chamber can be adapted, through the selection of the first ambient pressure, to the application requirements of the second microelectromechanical element. The distribution of the internal pressure in the second chamber can, according to the present invention, particularly advantageously be set to be very homogenous over the entire wafer, using the third and fourth step.

There are believed to be methods that use a getter material to subsequently reduce the pressure in a first chamber cannot achieve such advantages, in particular because in such a case the wafer bonding step typically takes place at a comparatively high pressure in order to provide an adequately high pressure in the second chamber.

The advantages according to the present invention also cannot be achieved by known methods based on resealing techniques.

Advantageous developments and specific embodiments result from the further descriptions herein.

Due to the fact that the first microelectromechanical element includes a rotational rate sensor, and the second microelectromechanical element includes an acceleration sensor, according to a specific embodiment of the present invention it is advantageously possible to situate a rotational rate sensor and an acceleration sensor in a narrow space, providing a process with which the different ideal operating pressures of these sensor types can be ensured.

Due to the fact that the wafer bonding technique includes a metallic bonding method, which may be an aluminum-germanium bonding method, according to a specific embodiment of the present invention it is advantageously possible that, despite the high temperature typical for a metallic bonding method during the wafer bonding, pressures can be ensured as desired in the first and second chamber. Advantageously, problems that can arise due to a premature activation of the getter material (while the first and second chamber are not yet completely hermetically sealed during the wafer bonding) can be minimized or prevented according to the present invention.

Due to the fact that a second ambient pressure, in particular a second gas pressure, prevails during the formation of the first and second chamber during the second step, according to a specific embodiment of the present invention it is possible for the second ambient pressure to be advantageously adapted to the requirements of the first microelectromechanical element. In particular, it may be provided to choose the second ambient pressure to be low, so that after the second step a low internal pressure correspondingly prevails in the chambers. Even through potential later outgassing of process gases, in this way with the aid of the getter material, it can be ensured that an optimal operating pressure for the first microelectromechanical element is provided. This may be possible due to the fact that the getter material does not first have to reduce the internal pressure in the first chamber after its activation, because the second ambient pressure can already be chosen to be low. Correspondingly, the danger of a saturation of the getter material is minimized. Further advantages result from the selection of a low second ambient pressure during the second step. In particular, the required overall sorption capacity of the getter material is smaller than would be the case if bonding took place at a higher gas pressure. As a result, the layer thickness of the getter can be reduced, which saves process costs during the getter deposition. Alternatively or in addition, in this way the surface to be occupied with getter material can be reduced. This can provide freedom in the configuration. It is for example conceivable to configure the getter material laterally offset from the MEMS structures, which are usually movable in the vertical direction (in particular of the first microelectromechanical element). In this way, when there is mechanical overload the MEMS element can be prevented from impacting against the getter surface and causing wear or particle formation.

It is conceivable that during the wafer bonding in the second step a low partial pressure of one (or more) noble gases is set. In this way it is advantageously possible to set the later internal pressure for the first microelectromechanical element particularly precisely in the range of the desired operating pressure of the first microelectromechanical element, because the noble gas atoms (of getter material) are not gettered. The later internal pressure of the first chamber can accordingly correspond to the set partial pressure (of the noble gas or gases) during the second step (or during the wafer bonding). Correspondingly, a defined gas atmosphere can be used during the second step.

In particular, it is conceivable that the second ambient pressure (or the partial pressure of the noble gas or gases) is in the range of the ideal operating pressure of the first microelectromechanical element, for example between 0.1 and 2 mbar, in particular for the case in which the first microelectromechanical element includes an acceleration sensor.

Due to the fact that the first ambient pressure is between 50 and 1000 mbar, the fourth step may be carried out in a defined gas atmosphere that in particular includes nitrogen and/or at least one noble gas, according to a specific embodiment of the present invention it is possible for the internal pressure that arises in the chamber after the fourth step to be between 50 and 1000 mbar, and thus adapted to the optimal operating pressure of particular sensor types (for example an acceleration sensor). At the same time, such a comparatively high first ambient pressure does not have a negative effect on the internal pressure of the first chamber, because the first chamber advantageously remains hermetically sealed in the third and fourth step. It is for example possible for the defined gas atmosphere to contain, during the fourth step, nitrogen, neon, and/or argon, or to be made up of a combination of these components.

Due to the fact that in the third step the opening is formed using a trench method or a laser drilling method, according to a specific embodiment of the present invention it is possible to provide a particularly efficient and possibly low-cost method for forming the opening.

Due to the fact that in the third step the opening is produced in the substrate or in the cap element, according to a specific embodiment of the present invention it is possible for the second chamber to lose its seal to the surrounding environment in the third step.

Due to the fact that in the fourth step the opening is sealed using a laser seal or using a layer deposition method, according to a specific embodiment of the present invention it is possible to ensure a particularly efficient and hermetically tight seal of the second chamber.

Due to the fact that in the first step the getter material and/or a further getter material is additionally placed on the substrate in a second region in a surrounding environment of the second microelectromechanical element, and/or is placed on the cap element in a second corresponding region, the second chamber formed in the second step additionally including the second region and/or the second corresponding region, according to a specific embodiment of the present invention it is possible to enable a further improved setting of the pressure in the second chamber. Correspondingly, a process can be achieved that has a further improved robustness against disturbance.

Due to the fact that the cap element includes a CMOS wafer element, according to a specific embodiment of the present invention it is possible to provide a CMOS-compatible process.

The system according to the present invention, including a substrate having a first microelectromechanical element and a second microelectromechanical element, and further including a cap element, according to a specific embodiment of the present invention has in contrast to the prior art the advantages already described in connection with the method according to the present invention for producing a system, or a specific embodiment of the method according to the present invention for producing a system.

Exemplary embodiments of the present invention are shown in the drawings and are explained in more detail in the following description.

In the various Figures, identical parts are always provided with the same reference characters, and therefore are as a rule only named or mentioned once.

BRIEF DESCRIPTION OF THE DRAWINGS

FIG. 5 shows a schematic representation of a method for producing a system according to a second specific embodiment of the present invention, after a fourth step.

FIG. 6 shows a schematic representation of a method for producing a system according to a third specific embodiment of the present invention, after a fourth step.

FIG. 7 shows a schematic representation of a method for producing a system according to a fourth specific embodiment of the present invention, after a fourth step.

FIG. 8 shows a schematic representation of a method for producing a system according to a fifth specific embodiment of the present invention, after a fourth step.

DETAILED DESCRIPTION

Figure 1:
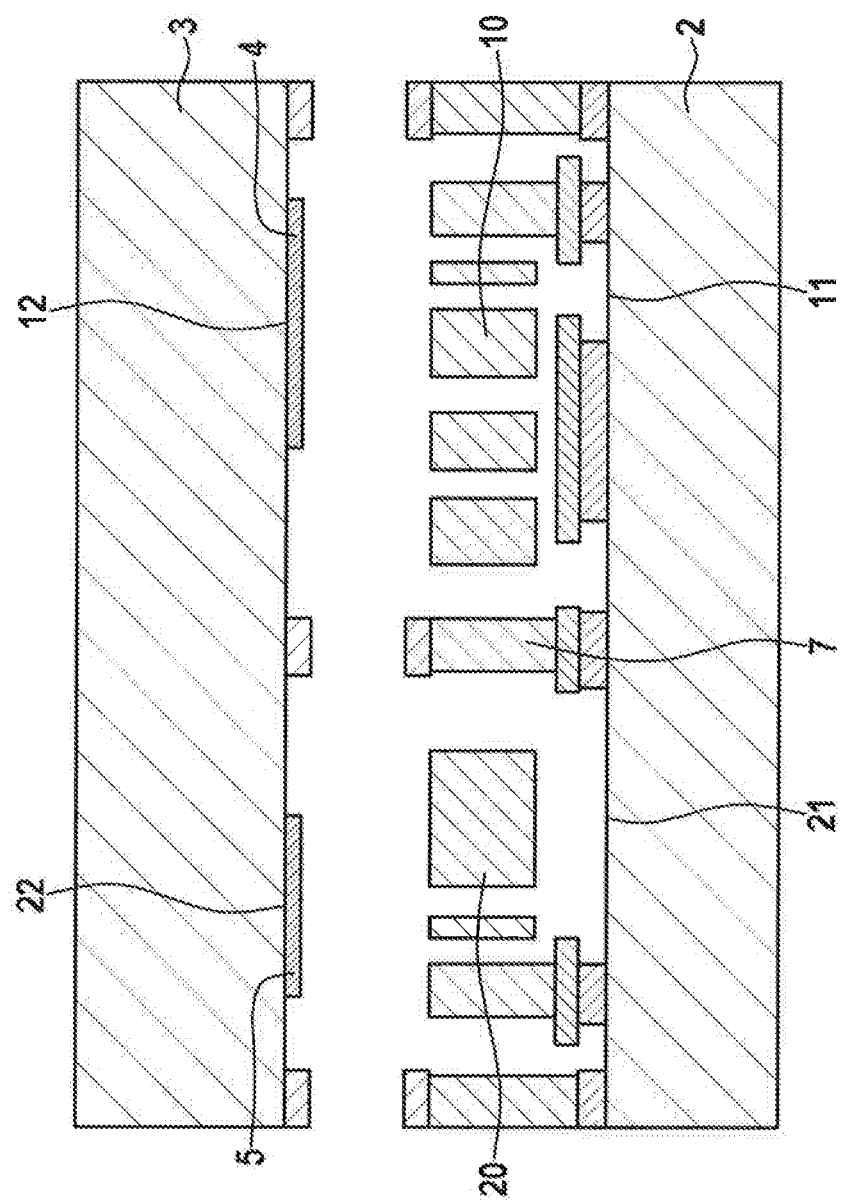
FIG. 1 shows a schematic representation of a method for producing a system according to a first specific embodiment of the present invention, after a first step.

FIG. 1 shows a schematic representation of a method for producing a system 1 according to a first specific embodiment of the present invention, after a first step. Shown is a substrate 2 on which a first microelectromechanical element 10 and a second microelectromechanical element 20 are situated. First and second microelectromechanical elements 10, 20 are for example different types of sensors that require different ambient pressures for their respectively ideal operation. Thus, the first microelectromechanical element 10 can be a rotational rate sensor and the second microelectromechanical element 20 can be an acceleration sensor. In addition, a cap element 3 is shown. A getter material 4 is situated/applied on a first corresponding region 12 on cap element 3. Alternatively or in addition, getter material 4 could also be situated in first region 11 on substrate 2, and in the vicinity of first microelectromechanical element 10. In the specific embodiment shown in FIG. 1, however, first region 11 is free of getter material 4. In addition, in the depicted specific embodiment a further getter material 5 is applied on cap element 3 in a second corresponding region 22. Further getter material 5 can be the same material as getter material 4, or may also be a different getter. Alternatively or in addition to the depicted configuration of further getter material 5, it is conceivable for further getter material 5 to be situated in second region 21 on substrate 2, and in the vicinity of the second microelectromechanical element 20.

Figure 2:
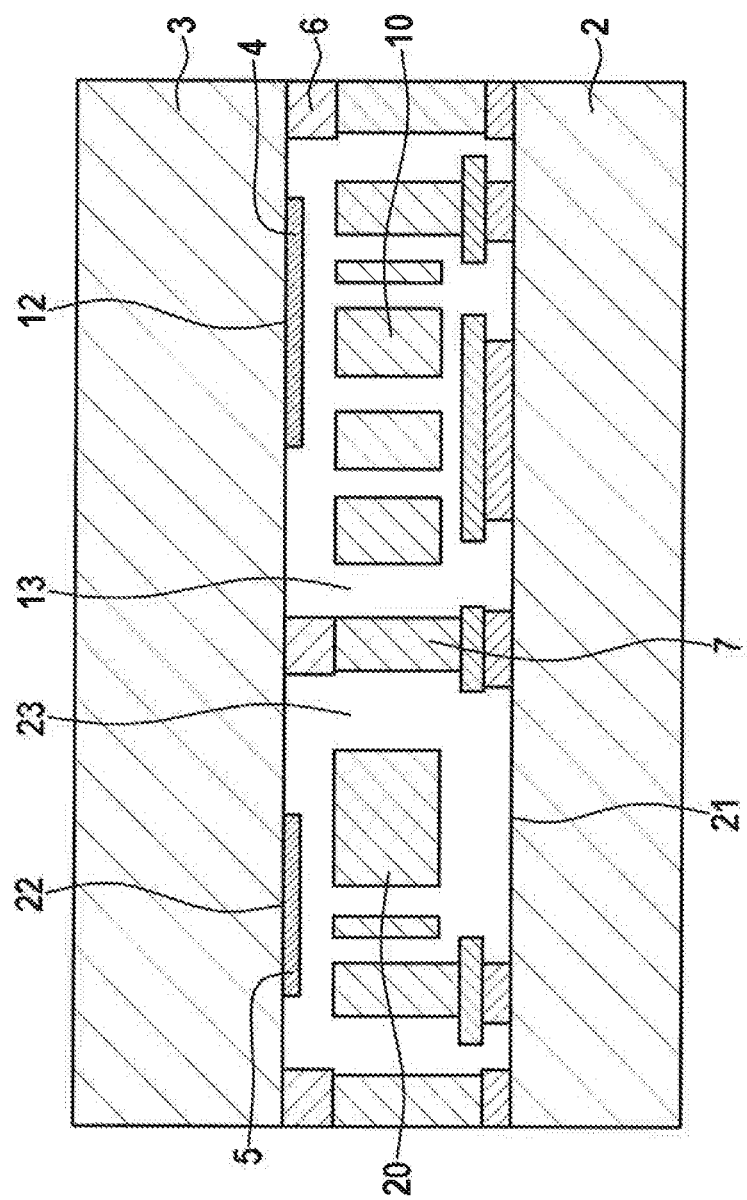
FIG. 2 shows a schematic representation of a method for producing a system according to a first specific embodiment of the present invention, after a second step.

FIG. 2 shows a schematic representation of a method for producing a system 1 according to a first specific embodiment of the present invention after or during a second step.

In the second step, substrate 2 and cap element 3 are brought together, using a wafer bonding technique, in such a way that a first chamber 13 and a second chamber 23 are formed. First microelectromechanical element 10 and getter material 4 are situated inside first chamber 13. Second chamber 23 contains second microelectromechanical element 20 and the further getter material 5. To separate the chambers 13, 23, a separating web 7 is formed between the two chambers 13, 23. Substrate 2 and cap element 3 are connected via bonding frame 6. The wafer bonding technique may be a metallic bonding method, in particular an aluminum-germanium bonding process. The second step, i.e. the wafer bonding, can advantageously be carried out at a low second ambient pressure that corresponds for example to the ideal operating pressure of first microelectromechanical element 10. This second ambient pressure is correspondingly also decisively important for determining the internal pressure in chambers 13, 23 immediately after the second step. For a rotational rate sensor, such an ideal operating pressure is typically in the range of a good vacuum, in particular between 0.1 and 2 mbar. Through the choice of such a low second ambient pressure, a saturation of getter material 4 in first chamber 13 during the second step can advantageously be prevented, because even for the case in which bonding frame 6 does not yet, or does not immediately, hermetically seal the two chambers (13, 23 (during the wafer bonding process), and getter material 4 is already activated by the temperature used in the bonding process, no large quantities of gas will flow from second chamber 23 (or from the surrounding environment) into first chamber 13.

Figure 3:
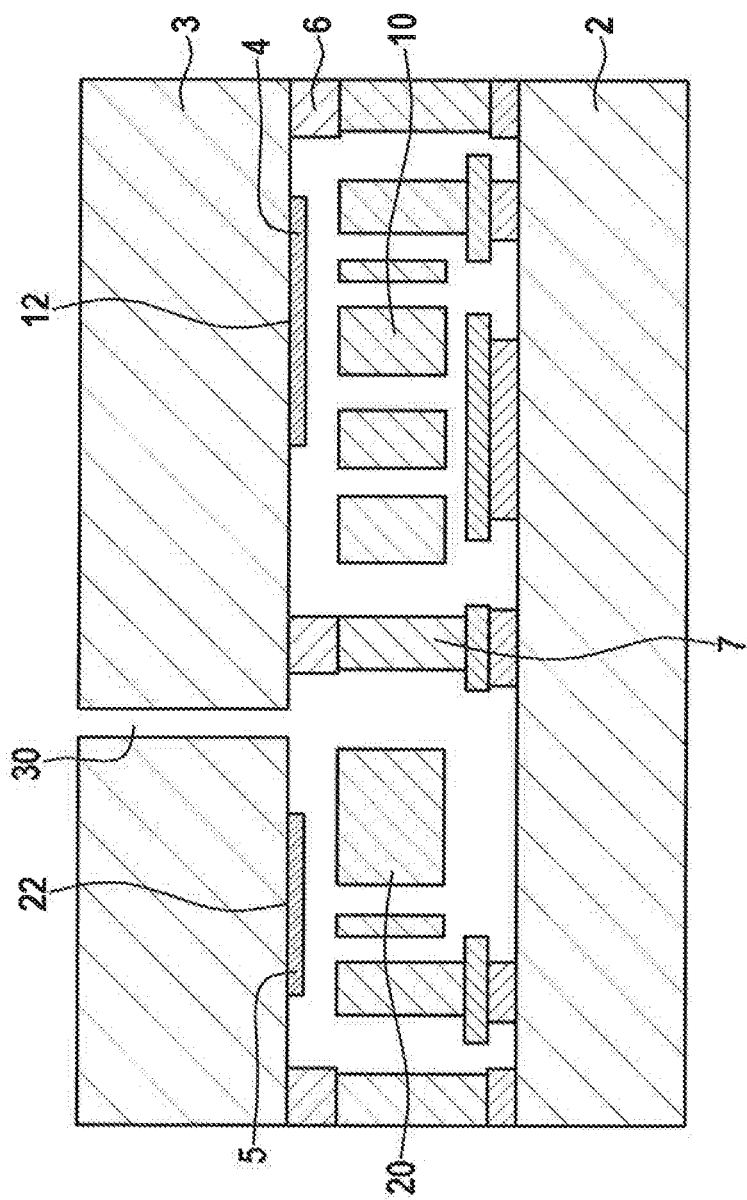
FIG. 3 shows a schematic representation of a method for producing a system according to a first specific embodiment of the present invention, after a third step.

FIG. 3 shows a schematic representation of a method for producing a system 1 according to a first specific embodiment of the present invention, after a third step. In the third step, an opening 30 is produced in second chamber 23, for example using a trench method, or using a laser drilling method. Via opening 30, second chamber 23 is ventilated, so that after opening 30 is formed a gas exchange with the surrounding environment can take place.

Figure 4:
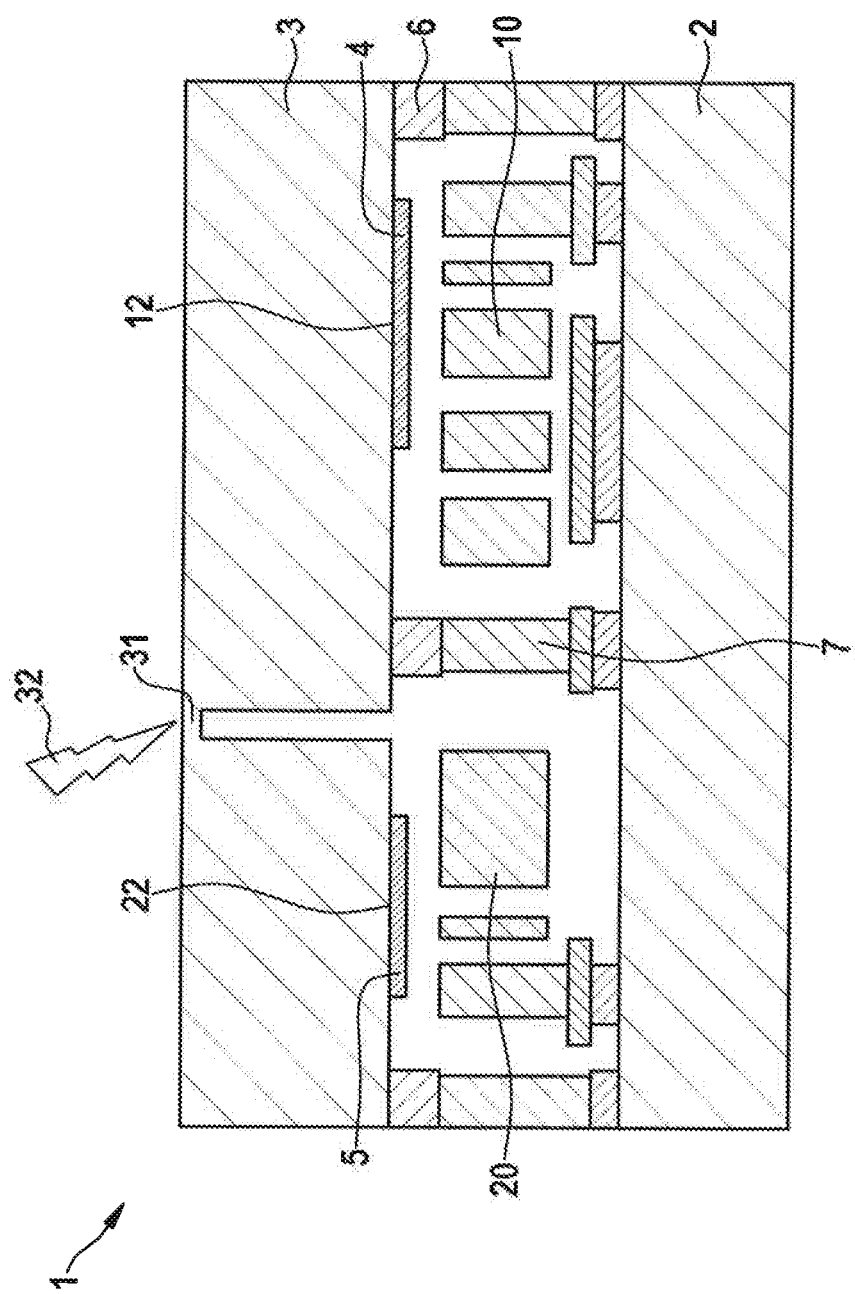
FIG. 4 shows a schematic representation of a method for producing a system according to a first specific embodiment of the present invention, during a fourth step.

FIG. 4 shows a schematic representation of a method for producing a system 1 according to a first specific embodiment of the present invention during a fourth step. In the fourth step, second chamber 23 is hermetically sealed by forming a closure 31 or seal 31 for opening 30. In the depicted specific embodiment, the closure 31 or seal 31 is formed using a laser sealing method 32. Other methods, such as layer deposition, are also possible. The fourth step takes place at a first ambient pressure that in principle can be set independently of the second ambient pressure. While the second ambient pressure may be selected to be very low in order to ensure an optimal internal pressure in first chamber 13 for the operation of first microelectromechanical element 10, the first ambient pressure during the fourth step can be selected to be significantly higher. For example, the first ambient pressure can be between 50 and 1000 mbar, which results in an internal pressure in second chamber 23 that is optimal for the operation of an acceleration sensor. In particular, it is conceivable that the gas atmosphere during the fourth step, and thus the gas enclosed in second chamber 23 after the fourth step, principally includes nitrogen and/or noble gases, or is made up of one or more of these components. In this way, the internal pressure in second chamber 23 can be set efficiently. Later outgassing process gases (for example $H_2$) are then absorbed by the further getter material 5, so that the internal pressure is advantageously maintained. Correspondingly, later outgassing process gases are also absorbed by the getter material 4 in first chamber 13.

FIG. 5 shows a schematic representation of a method for producing a system according to a second specific embodiment of the present invention, after a fourth step. The second specific embodiment corresponds to the first specific embodiment (FIGS. 1 through 4), with the difference that no further getter material 5 is situated in second chamber 23.

FIG. 6 shows a schematic representation of a method for producing a system according to a third specific embodiment of the present invention after a fourth step. The third specific embodiment corresponds to the first specific embodiment shown in FIGS. 1 through 4, with the difference that opening 30 of second chamber 23 was produced in the third step not in cap element 3, but rather in substrate 2. Correspondingly, seal 31 of opening 30 is also situated on substrate 2.

FIG. 7 shows a schematic representation of a method for producing a system according to a fourth specific embodiment of the present invention, after a fourth step. The fourth specific embodiment essentially includes the features of the second specific embodiment (FIG. 5). In addition, cap element 3, or the cap wafer, includes a CMOS wafer element 8. In the depicted fourth specific embodiment, in the third step opening 30 was made through cap element 3 and through CMOS wafer element 8 in order to ventilate second chamber 23. Correspondingly, in the fourth step opening 30 was sealed in the region of cap element 3 by a seal 31. In addition, a via 9 (TSV) is present by which electrical parts in CMOS wafer element 8 can be contacted. In addition, the specific embodiment includes a rewiring level and a solder ball 33 for mounting on a circuit board. In the case where a CMOS wafer is used, the present invention has particular advantages, because the outgassing risk after the wafer bonding is particularly high.

FIG. 8 shows a schematic representation of a method for producing a system according to a fifth specific embodiment of the present invention, after a fourth step. The fifth specific embodiment essentially includes the features of the fourth specific embodiment (FIG. 7). Differing from the fourth specific embodiment, however, in the third step opening 30 is not made in cap element 3 and CMOS wafer element 8, but rather in substrate 2. Correspondingly, seal 31 of opening 30 is also situated on substrate 3. In addition, in the fifth specific embodiment a further getter material is situated in second chamber 23.

What is claimed:

1. A method for producing a system, the system including a first microelectromechanical element and a second microelectromechanical element, the method comprising:
    providing, in a first task, a substrate having the first microelectromechanical element and the second microelectromechanical element, and a cap element, a getter material being situated on the substrate in a first region in a surrounding environment of the first microelectromechanical element and/or on the cap element in a first corresponding region;
    situating, in a second task, following the first task, the cap element on the substrate using a wafer bonding technique so that a sealed first chamber is formed that contains the first microelectromechanical element as well as the first region and/or the first corresponding region, a sealed second chamber additionally being formed that contains the second microelectromechanical element, wherein the wafer bonding technique is carried out at a pressure that is below an ideal pressure for operation of the second microelectromechanical element;
    producing, in a third task, following the second task, an opening in the second chamber; and
    sealing, in a fourth task, following the third task, the opening in the second chamber at a first ambient pressure, in particular a first gas pressure, where an internal pressure of the second microelectromechanical element is not set until the fourth task through a selection of the first ambient pressure when the opening in the second chamber is sealed.

2. The method of claim 1, wherein the first microelectromechanical element includes a rotational rate sensor, and the second microelectromechanical element includes an acceleration sensor.

3. The method of claim 1, wherein the wafer bonding technique includes a metallic bonding process.

4. The method of claim 1, wherein a second ambient pressure, in particular a second gas pressure, prevailing during the formation of the first and second chambers during the second task.

5. The method of claim 1, wherein the first ambient pressure is between 50 and 1000 mbar.

6. The method of claim 1, wherein the opening is formed in the third task using a trench method or a laser drilling process.

7. The method of claim 1, wherein the opening is produced in the third task in the substrate or in the cap element.

8. The method of claim 1, wherein the opening is sealed in the fourth task using a laser seal or using a layer deposition process.

9. The method of claim 1, wherein, in the first task, the getter material and/or a further getter material is additionally situated on the substrate in a second region in a surrounding environment of the second microelectromechanical element and/or on the cap element in a second corresponding region, the second chamber formed in the second task additionally containing the second region and/or the second corresponding region.

10. The method of claim 1, wherein the cap element includes a CMOS wafer element.

11. The method of claim 1, wherein the first ambient pressure is between 50 and 1000 mbar, the fourth task being carried out in a defined gas atmosphere, in particular having nitrogen and/or at least one noble gas.

12. The method of claim 1, wherein the wafer bonding technique includes an aluminum-germanium bonding process.

* * * * *